(12) United States Patent
Myers et al.

(10) Patent No.: US 11,006,524 B2
(45) Date of Patent: May 11, 2021

(54) CIRCUIT BOARD INTERPOSER

(71) Applicant: Apple Inc., Cupertino, CA (US)

(72) Inventors: Scott A. Myers, Saratoga, CA (US);
James B. Smith, San Francisco, CA (US); Dale T. Morgan, San Jose, CA (US); Shayan Malek, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/875,886

(22) Filed: Jan. 19, 2018

(65) Prior Publication Data

US 2019/0082535 A1 Mar. 14, 2019

Related U.S. Application Data

(60) Provisional application No. 62/556,192, filed on Sep. 8, 2017.

(51) Int. Cl.
*H05K 1/14* (2006.01)
*H05K 1/11* (2006.01)
*H05K 1/02* (2006.01)
*H05K 3/00* (2006.01)
*H05K 3/46* (2006.01)
*H05K 3/20* (2006.01)

(52) U.S. Cl.
CPC ............ *H05K 1/144* (2013.01); *H05K 1/028* (2013.01); *H05K 1/11* (2013.01); *H05K 3/0011* (2013.01); *H05K 3/4644* (2013.01); *H05K 3/202* (2013.01); *H05K 2201/042* (2013.01); *H05K 2201/09009* (2013.01); *H05K 2201/1075* (2013.01); *H05K 2201/10378* (2013.01); *H05K 2201/2018* (2013.01); *H05K 2203/0235* (2013.01); *H05K 2203/302* (2013.01)

(58) Field of Classification Search
CPC .......... H05K 1/144; H05K 1/028; H05K 1/11; H05K 3/0011; H05K 3/4644; H05K 3/202
USPC ........................................................ 361/749
See application file for complete search history.

(56) References Cited

U.S. PATENT DOCUMENTS

| | | |
|---|---|---|
| 5,491,303 A | 2/1996 | Weiss |
| 6,198,630 B1 * | 3/2001 | Cromwell ........... H01L 23/4006 165/80.3 |
| 6,414,248 B1 | 7/2002 | Sundstrom |
| 6,979,202 B2 | 12/2005 | Benham |

(Continued)

*Primary Examiner* — Tremesha S Willis
(74) *Attorney, Agent, or Firm* — Dickinson Wright RLLP

(57) ABSTRACT

An interposer for mechanically and electrically connecting two circuit boards is described. The interposer can be bent to enclose an area of a circuit board. The interposer can include a first layer external to the enclosed area. The first layer can be conductive and can serve as an EMI shield. The interposer can also include a second layer internal to the enclosed area. The second layer can be non-conductive but can carry multiple discrete pins that can electrically couple the first and second circuit boards and provide signal transmission pathways between the circuit boards. The interposer can be formed by folding a sheet of conductive material having different cutout regions that forms a comb pattern into multiple stacked layers. Then, the bent regions that connect the stacked layers can be removed so that the conductive bars in the comb patterns can be separated and isolated to form discrete pins.

13 Claims, 13 Drawing Sheets

(56) References Cited

U.S. PATENT DOCUMENTS

| | | |
|---|---|---|
| 8,283,767 B1 | 10/2012 | Berry |
| 9,033,740 B2 | 5/2015 | Shahoian |
| 9,230,875 B2 | 1/2016 | Zhao et al. |
| 2009/0065921 A1* | 3/2009 | Yamazaki ............ H01L 23/4985 257/686 |
| 2012/0228749 A1* | 9/2012 | Pagaila ............. H01L 23/49838 257/659 |
| 2012/0262862 A1* | 10/2012 | Johnson .................... G06F 1/32 361/679.02 |
| 2014/0070368 A1* | 3/2014 | Oyamada .......... H01L 23/49822 257/532 |
| 2015/0295362 A1 | 10/2015 | Tziviskos et al. |
| 2016/0021756 A1 | 1/2016 | Lee et al. |
| 2018/0331051 A1* | 11/2018 | Dogiamis ............... H01L 23/58 |

* cited by examiner

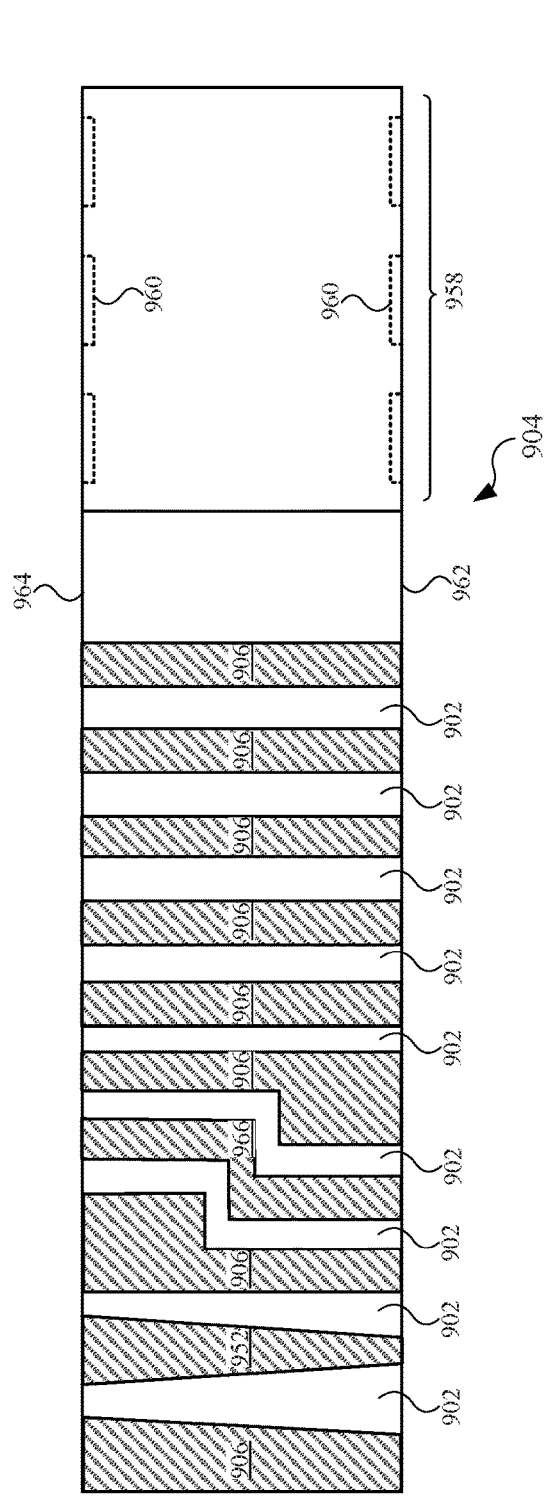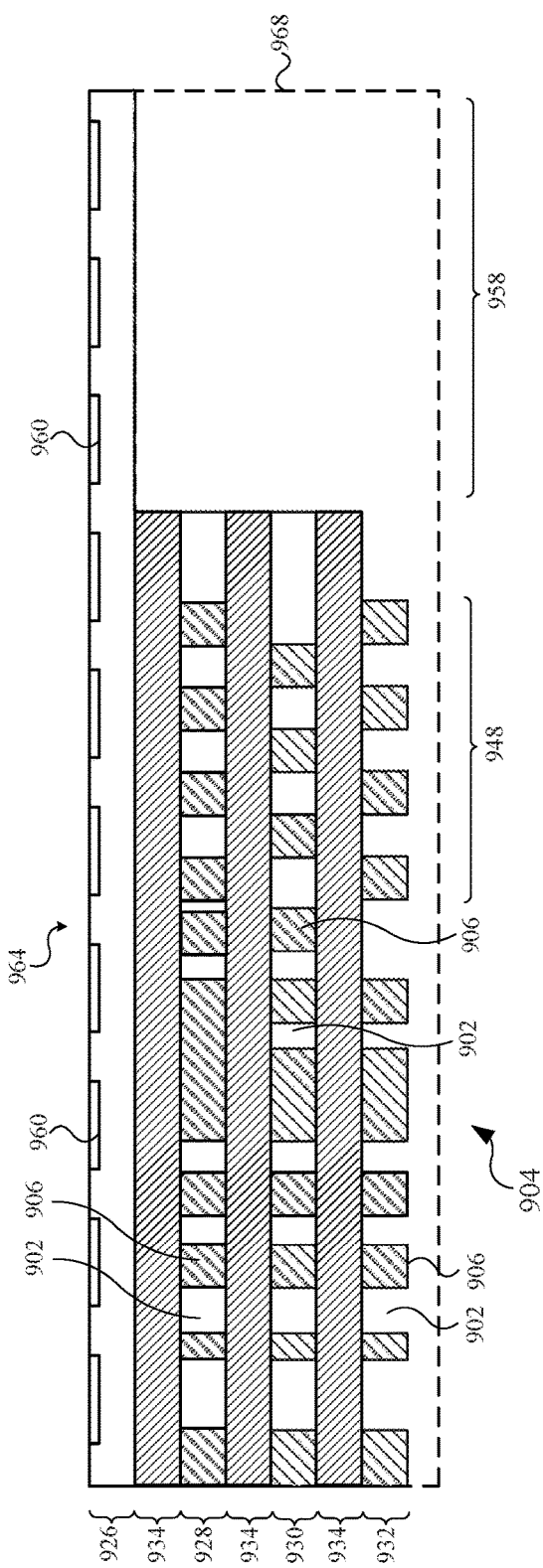

CIRCUIT BOARD INTERPOSER

CROSS-REFERENCE TO RELATED APPLICATIONS

The present application claims the benefit of U.S. Provisional Application No. 62/556,192, entitled "CIRCUIT BOARD INTERPOSER," filed Sep. 8, 2017, the content of which is incorporated herein by reference in its entirety for all purposes.

FIELD

The described embodiments relate generally to interface structures that connect circuit boards of electronic devices. More specifically, the described embodiments relate to structure of interposers that can mechanically and electrically connect multiple circuit boards and methods of making such interposers.

BACKGROUND

Rigid circuit boards such as those used as main logic boards in electronic devices have become successively more densely packed with components as increasingly complex feature sets are provided by such electronic devices. Increasing the footprint area of a circuit board sometimes requires system-level tradeoffs, for example, by reducing the sizes of other system modules such as batteries, speakers, or cameras. Such tradeoffs can often be sufficiently disadvantageous to make them unacceptable to system performance. Hence, it may be more preferable to stack one or more circuit boards above the footprint of the first circuit board to effectively multiply the area available for electronic component placement on circuit boards without requiring a footprint size reduction in another system module. However, providing an interposer that serves as an interface structure that mechanically and electrically connects a circuit board positioned above another circuit board can be expensive and challenging.

SUMMARY

This paper describes various interposer structures that can mechanically and electrically connect multiple circuit boards and methods of making such interposer structures.

According to one embodiment, an interposer for mechanically and electrically coupling a first circuit board to a second circuit board is described. The interposer can include an electrically conductive layer that can be continuous. The interposer can also include a substrate formed of an insulating material and coupled to the electrically conductive layer such that the substrate can define a first mounting surface and a second mounting surface. The first and second mounting surfaces can respectively be coupled to the first and second circuit boards. The first and second mounting surfaces can be perpendicular to the electrically conductive layer and can be opposite to each other. The interposer can further include discrete pins formed of an electrically conductive material. The discrete pins can be carried by the substrate and be positioned from the first mounting surface to the second mounting surface such that the discrete pins can transmit signals between the first and second circuit boards.

According to another embodiment, a circuit assembly is described. The circuit assembly can include a first circuit board, a second circuit board separated from the first circuit board by a distance, and an interposer strip mechanically secured between the first circuit board and the second circuit board. The interposer strip can be bent to enclose at least an area of the first circuit board. The interposer strip can include a first layer external to the area and a second layer internal to the area. The first layer can be an electrical conductor that can provide electromagnetic shielding to the area. The second layer can include an insulating substrate carrying discrete pins that are electrically conductive. The discrete pins can electrically connect the first circuit board to the second circuit board.

According to yet another embodiment, a method for making an interposer using a sheet formed of a conductive material is described. The method can include forming cutout regions at the sheet. The method can also include folding the sheet to form a new shape that includes conductive layers stacked on top of each other. One of the conductive layers can include a comb pattern characterized as having conductive bars alternating with the cutout regions. The conductive layers can be joined by one or more bent regions of the sheet. The method can also include forming insulating materials between the conductive layers. The method can further include removing the one or more bent regions from the folded sheet such that the conductive layers can be separated from each other and isolated by the insulating materials and the conductive bars are separated by the cutout regions.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which:

FIG. 12 is a side view of the interposer shown in FIG. 11.

FIG. 13 is a top view of the interposer shown in FIG. 11.

Figure 1:
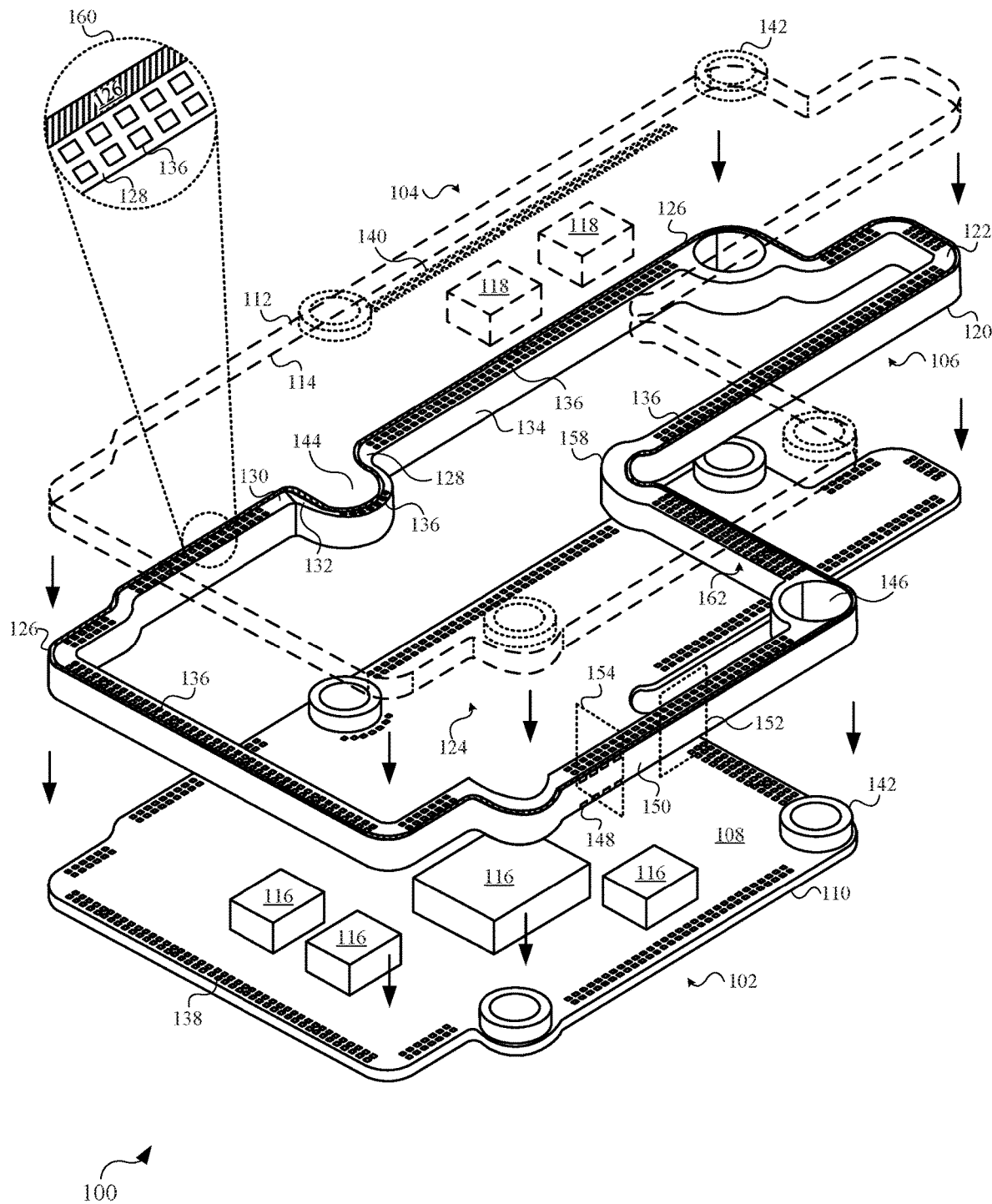
FIG. 1 is an exploded view of a circuit assembly in accordance with some embodiments.

Those skilled in the art will appreciate and understand that, according to common practice, various features of the drawings discussed below are not necessarily drawn to scale, and that dimensions of various features and elements of the drawings can be expanded or reduced to more clearly illustrate the embodiments of the present invention described herein.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; other embodiments may be used, and changes may be made without departing from the spirit and scope of the described embodiments.

To reduce the size of consumer electronic products, sometimes it is desirable to replace a single large circuit board with multiple circuit boards stacked above each other to reduce the footprint area occupied by the circuit boards. However, providing a satisfactory interposer that serves as an interface structure between the circuit boards has been challenging from the design standpoint. Mechanically, the circuit boards are required to be separated sufficiently apart to provide sufficient clearance space for the components carried on the lower circuit board. Hence, an interposer board needs to be quite thick compared to the circuit boards. Electrically, constructing vias that can provide high-speed pathways for high frequency signals to be transmitted between the circuit boards can be expensive. For example, conventionally an interposer board is constructed using a labor-intensive process that includes laminating substrate material layer by layer until a desired total thickness is achieved. Each time a new layer is formed, the new layer is drilled to form the vias. Since a via is not formed by a single drill, the portion of the via of each layer may not align perfectly. Any slight misalignment may affect the signal transmission of the via and signal integrity.

Embodiments described herein relate to new interposers that are easy to produce and provide superior electrical and mechanical performance compared to conventional interposers. In term of the structure, an exemplary interposer can have an elongated structure and can be positioned between two circuit boards, preferably along the outer perimeter (or part of the outer perimeter) of a circuit board. The interposer can include a first layer that can be formed of a conductive material such as a metal. The interposer can also include a second layer that can include an insulating substrate carrying multiple discrete pins that are formed of a conductive material. The first layer and the second layer can be oriented generally perpendicular to the circuit boards so that the side edges of the two layers can cooperate to define two mounting surfaces that can be coupled to the circuit boards. The conductive pins can span from the first mounting surface to the second mounting surface so that the pins can be used as communication and/or thermal pathways between the circuit boards. Since solid conductive pins are used instead of conventional vias that may be formed by a series of drilling, the solid communication pathways provide significantly improved high-speed signal transmission compared to conventional interposers.

An exemplary interposer can be elongated and in a shape of a strip. Both the first layer and the second layer can be made of flexible materials so that the interposer strip can be bent into different shapes. As such, the interposer strip can be shaped in accordance with the contour of a circuit board or a portion of the circuit board. Two distal ends of the interposer strip can join to form an enclosure that can enclose an area of the circuit board. The first layer of the interposer can simultaneously serve multiple purposes. First, when the interposer strip encloses the area, the first layer, which is conductive and perpendicular to the circuit board, can be external to the area and completely surround the area. As a result, the conductive first layer can serve as an electromagnetic shield that protects the components on the circuit boards from interference. Second, since the conductive first layer is in connection with both the circuit boards, the first layer can also serve as a common ground for both circuit boards. Third, the first layer can include castellation features on an exterior surface so that interposer can also serve as the mechanical structure that connects the two circuit boards using soldering.

An exemplary interposer in accordance with some embodiments can be manufactured using simple and inexpensive procedures. A method for making an exemplary interposer can begin with a sheet of conductive material such as a sheet of metal. The sheet can be stamped or cut to form multiple cutout regions. The cutout regions can form a comb pattern that can include conductive bars alternating with cutout regions. The cutout regions can be positioned towards a first edge of the sheet so that a region of the sheet that is near a second edge opposite the first edge can be free of the cutout regions.

After such cutout regions are formed on the sheet, the sheet can be folded one or more times so that the sheet can become multiple layers stacked together. A first layer can correspond to the region near the second edge that is free of cutout regions. One or more other layers can correspond to other regions of the sheet that includes the comb pattern with alternating conductive bars and cutout regions. At this folded stage, the stacked layers remain joined to each other by one or more bent regions of the sheet. Insulating materials can be added between the layers so that conductive layers are alternating with insulating layers.

After the insulating layers are formed and secured with the conductive layers, the bent regions of the sheet can be removed so that the stacked conductive layers are now separated form each other and are isolated by the insulating layers. The conductive bars in the comb pattern that are originally joined are also separated. Among the conductive layers, the conductive bars are isolated by the insulating layers. Within a conductive layer, the conductive bars are separated from each other by spaces that correspond to the cutout regions. Hence, multiple discrete pins (i.e. the separated conductive bars) can be formed by this folding and removal process. In addition, the first layer that is free of cutout regions can remain as a continuous piece of conductive material that can be used as the shielding layer of the interposer.

The described method of forming an interposer can start with an elongated sheet of conductive material that can take the form of a long strip that can define a long longitudinal axis. The folding can be along one or more fold line that is parallel to the longitudinal axis. The removal can also be along planes that are parallel to the longitudinal axis. Both the conductive material and the insulating material can be flexible. As a result, the interposer formed can also be a strip, which can be bent into any shape. Conventional interposers are formed by a series of laminations and are normally rigid. Hence, conventional interposers cannot be bent or serve as a shield for circuit boards. The interposers described herein can be all-in-one structures that can provide better electrical connection, improved mechanical support, and superior electromagnetic shielding. At the same time, the manufacturing of the interposers can be significantly simpler and cheaper than that of conventional interposers.

These and other embodiments are discussed below with reference to FIGS. 1-16; however, those skilled in the art will readily appreciate that the detailed description given herein with respect to these figures is for explanatory purposes only and should not be construed as limiting.

FIG. 1 illustrates an exploded view of an exemplary circuit assembly 100 in accordance with some embodiments. Circuit assembly 100 can include a first circuit board 102, a second circuit board 104 and an interposer 106 positioned in between the two circuit boards. Second circuit board 104 is represented by dashed lines for not obstructing the view of other parts of circuit assembly 100 below second circuit board 104. The circuit boards 102 and 104 can both be rigid circuit boards such as the main logic boards of an electronic device. First circuit board 102 can include a first surface 108 facing second circuit board 104 and a second surface 110 opposite the first surface 108. Similarly, second circuit board 104 can include a first surface 112 opposite a second surface 114 that faces first circuit board 102. The circuit boards can carry various electrical and/or electronic components including integrated circuits, processors, memories, capacitors, resistors, transistors, inductors, diodes, batteries, switches, connectors and/or other suitable components. For simplicity, the components carried on first surface 108 of first circuit boards 102 are represented by components 116 and the components carried on first surface 112 of second circuit boards 104 are represented by components 118. Both circuit boards 102 and 104 can also be double-sided and can include components on both surfaces.

Interposer 106 can be used to mechanically and electrically connect first circuit board 102 and second circuit board 104. When assembled, second circuit board 104 can be positioned above first circuit board 102 and the two circuit boards can be separated by a distance to provide sufficient clearance space to components 116 carried on the first circuit board 102. Interposer 106 can provide the mechanical support and maintain the separation between the circuit boards. Interposer 106 can be characterized as having a first mounting surface 120 (e.g. the bottom surface of interposer 106 in FIG. 1) that is configured to connect and be in contact with first surface 108 of first circuit board 102. Interposer 106 can also include a second mounting surface 122 (e.g. the top surface of interposer 106 in FIG. 1) that is configured to connect to and be in contact with second surface 114 of second circuit board 104. Interposer 106 can take the form of a long strip that can be bent, based on the contour of the circuit boards, to from an enclosure that encloses an area 124 of first circuit board 102. In some cases, interposer 106 can also be referred to as interposer strip, interposer structure, interposer element, interconnect interface, interposer board, and other suitable terms. In the particular embodiment shown in FIG. 1, interposer 106 can be shaped substantially in accordance with a perimeter of first circuit board 102 such that interposer 106 can enclose substantially the entire first circuit board 102. However, it is understood that interposer 106 can also be bent into other suitable shapes.

In term of the structure, interposer 106 can include a first layer 126 (shaded and best shown in enlarged view 160) that is external to area 124 and a second layer 128 that can be an internal layer facing area 124. Both first layer 126 and second layer 128 can be oriented generally perpendicular to circuit boards 102 and 104. First layer 126 can be formed of an electrical conductor such as a metal. In one case, first layer 126 can be a long continuous strip of electrically conductive layer. By using interposer 106 that includes first layer 126 to enclose area 124, interposer 106 can serve as an electromagnetic shield for area 124 so that components 116 and signal transmission between first and second circuit boards 102 and 104 are protected from electromagnetic interference and/or magnetic field interference. The first distal end 130 of interposer 106 can meet the second distal end 132 to form this enclosure structure. As first layer 126 can be a solid and conductive exterior wall of interposer 106 that is positioned external to area 124, first layer 126 can also be electrically grounded to provide grounding for first and second circuit boards 102 and 104. Since first layer 126 can be connected to both circuit boards 102 and 104, first layer 126 can also serve as a common ground for the circuit boards. First layer 126 can also provide structure rigidity to the interposer 106 and can improve the overall structural performance of circuit assembly 100.

Second layer 128 of interposer 106 can include a substrate 134 formed of an insulating material. The substrate can take the form of a matrix that can be formed by various ways that will be discussed in detail below. The substrate 134 can carry multiple discrete pins 136 that are electrically conductive and that are formed of a solid electrically conductive material such as metal. The pins 136 are represented in FIG. 1 by numerous small rectangles on substrate 134 throughout the length of interposer 106 and are also shown in the enlarged view 160. As shown in FIG. 1, interposer 106 can mostly include two rows of pins 136. However, there can also be any numbers of rows and columns of pins 136. Also, different sections of the interposer can include different rows of pins. For example, there can be one row of pins 136 at a recessed region 144 and three rows of pins 136 at a region 162. In some embodiments, the conductive material of the pins 136 can be the same as the conductive material of first layer 126 for reasons that will be explained below. The pins 136 can span from first mounting surface 120 to second mounting surface 122 such that the pins 136 can be used to transmit signals between first and second circuit boards 102 and 104. The discrete pins 136 can be separated and isolated from each other by the insulating substrate 134 so that each pin 136 can serve as an individual electrical communication pathway and/or a thermal conductive pathway. First circuit board 102 can include multiple pin patterns 138 that correspond to and align with the pins 136 of interposer 106. On surface 114, second circuit board 104 can also include multiple pin patterns 140 that correspond to and align with the pins 136 of interposer 106. Hence, when circuit assembly 100 is assembled, first circuit board 102 and second circuit board 104 can communicate with each other using high speed and/or high frequency signals through the pins 136. For simplicity, only a set of exemplary pin patterns 140 are shown in the dash lined second circuit board 104 in FIG. 1.

Circuit boards 102 and 104 can also include one or more standoff feature 142, each of which can receive one or more standoff (not shown) used to mechanically couple the two circuit boards 102 and 104 and/or to mount the circuit boards 102 and 104 to a structural element such as a housing of an electronic device. Interposer 106 can be bent and be contoured around the standoff features 142 so that interposer 106 can enclose area 124 in a continuous manner. In some cases, interposer 106 can contour to exclude a standoff feature 142, such as at the recessed area 144, or can contour to enclose a standoff feature 142, such as at the area 146.

Interposer 106 can also include multiple castellation features 148 on an exterior surface 150 of first layer 126. A castellation feature can be positioned near one or both mounting surfaces 120 and 122. Castellation features 148 can be features recessed both from the exterior surface 150 of first layer 126 and from a mounting surface 120 or 122. Castellation features 148 can provide recessed areas for solders to settle when interposer 106 is secured to circuit boards 102 and 104. For simplicity, only exemplary castellation features 148 are shown near box 154, but it should be understood that castellation features 148 can be located at any suitable location of interposer 106 and can be located throughout the entire exterior surface 150.

Figure 2:
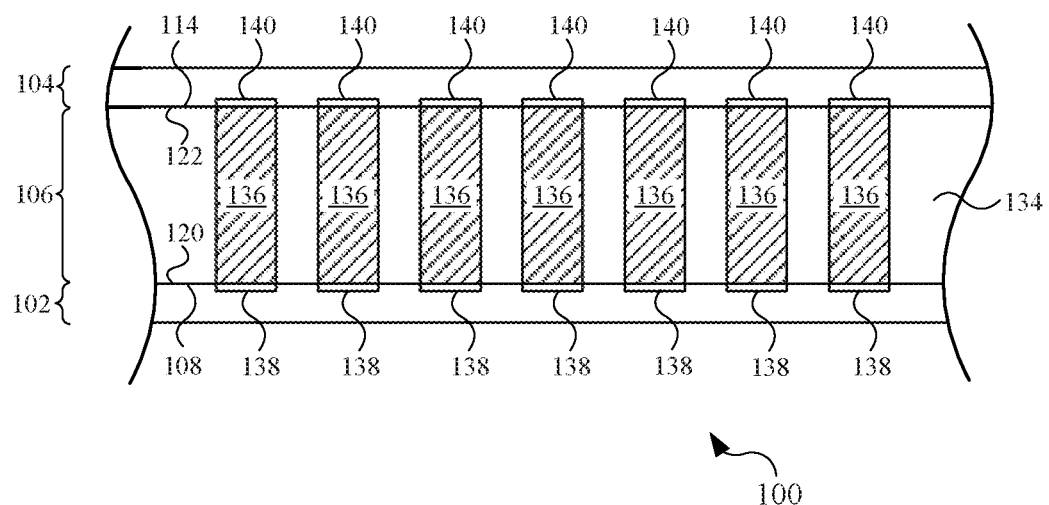
FIG. 2 is a cross-sectional view of a circuit assembly in accordance with some embodiments.
Figure 3:
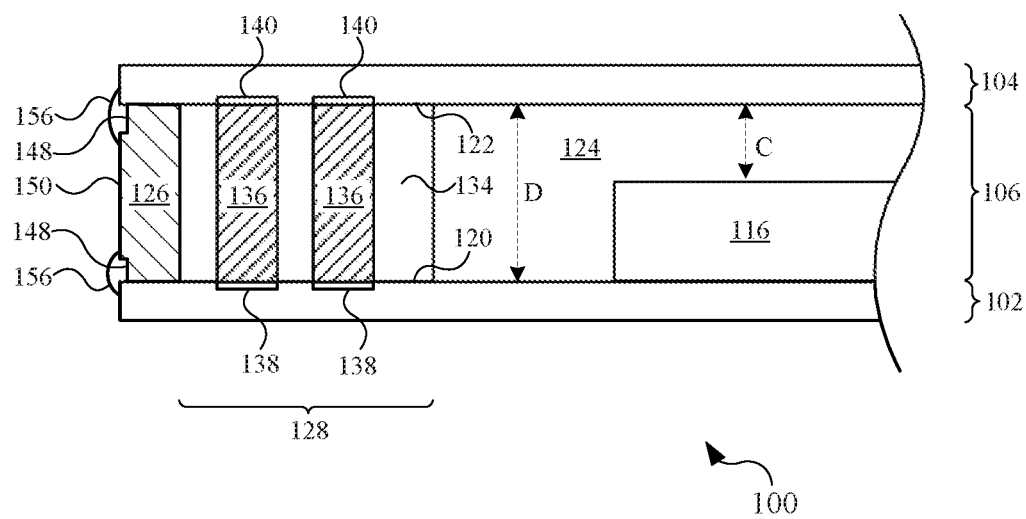
FIG. 3 is another cross-sectional view of a circuit assembly in accordance with some embodiments.

FIGS. 2 and 3 illustrate different cross-sectional views of circuit assembly 100 when circuit boards 102 and 104 are coupled to interposer 106. FIG. 2 shows a cross-sectional view of a section of circuit assembly 100 shown in FIG. 1 marked by box 152. Circuit assembly 100 can include first circuit board 102, second circuit board 104, and interposer 106 mechanically secured in between the two circuit boards. First mounting surface 120 of interposer 106 can be in contact with first surface 108 of first circuit board 102. Second mounting surface 122 of interposer 106 can be in contact with second surface 114 of second circuit board 104. First circuit board 102 and second circuit board 104 can respectively include pin patterns 138 and pin patterns 140. A pin pattern 138 and a pin pattern 140 can respectively be connected to the circuitry (not shown) such as an electrical trace of the circuit board 102 and of circuit board 104. Hence, pin patterns 138 and 140 can be electrically connected to one or more components 116 and/or 118 (shown in FIG. 1) and can be used to transmit and receive signals from components 116 and/or 118.

Multiple discrete pins 136 (shaded) can be carried by substrate 134 and be aligned with the pin patterns 138 and 140. As shown in FIG. 2, the pins 136 can span from first mounting surface 120 to second mounting surface 122 across the entire height of substrate 134. Hence, when interposer 106 couples first circuit board 102 and second circuit board 104 together, pins 136 can provide multiple individual electrical communication pathways between first circuit board 102 and second circuit board 104 through the pin patterns 138 and 140 so that, for example, signals from one circuit board can be transmitted to another circuit board for processing.

FIG. 3 shows a different cross-sectional view of a section of circuit assembly 100 shown in FIG. 1 marked by box 154. FIG. 3 shows two rows of pins 136 that are connected to pin patterns 138 and 140. Second circuit board 104 can be positioned above first circuit board 102 and be separated from first circuit board 102 by a distance D. Interposer 106 not only can mechanically couple the two circuit boards 102 and 104, but can also maintain the distance D. The height of interposer 106 can be multiple time of the thickness of either circuit board so that a clearance C can be maintained between component 116 and second circuit board 104. In one case, the height of interposer 106 can be at least twice of the thickness of either circuit board.

FIG. 3 shows one side of internal area 124 that is enclosed by interposer 106. First layer 126 of interposer 106 can be external to area 124 and can serve an electromagnetic shield that encloses area 124. Second layer 128 of interposer 106 can be internal to area 124 and can carry the pins 136. As shown, first layer 126 and second layer 128 can be generally perpendicular to circuit boards 102 and 104. Hence, side edges of first layer 126 and second layer 128 can cooperate to define mounting surfaces 120 and 122 that are in contact with the surfaces of circuit boards 102 and 104. In one case, first layer 126 can be flush with second layer 128 so that mounting surfaces 120 and 122 can be flat. In another case, the first layer and the second layer 128 do not have to be flush and second layer 128 alone can define the mounting surfaces 120 and 122. On the exterior surface 150 of first layer 126, castellation features 148 can be used to receive solders 156 that mechanically secure interposer 106 between first circuit board 102 and second circuit board 104. Alternatively or additionally, adhesive can also be applied on mounting surfaces 120 and 122 to secure interposer 106 between the circuit boards.

Figure 4:
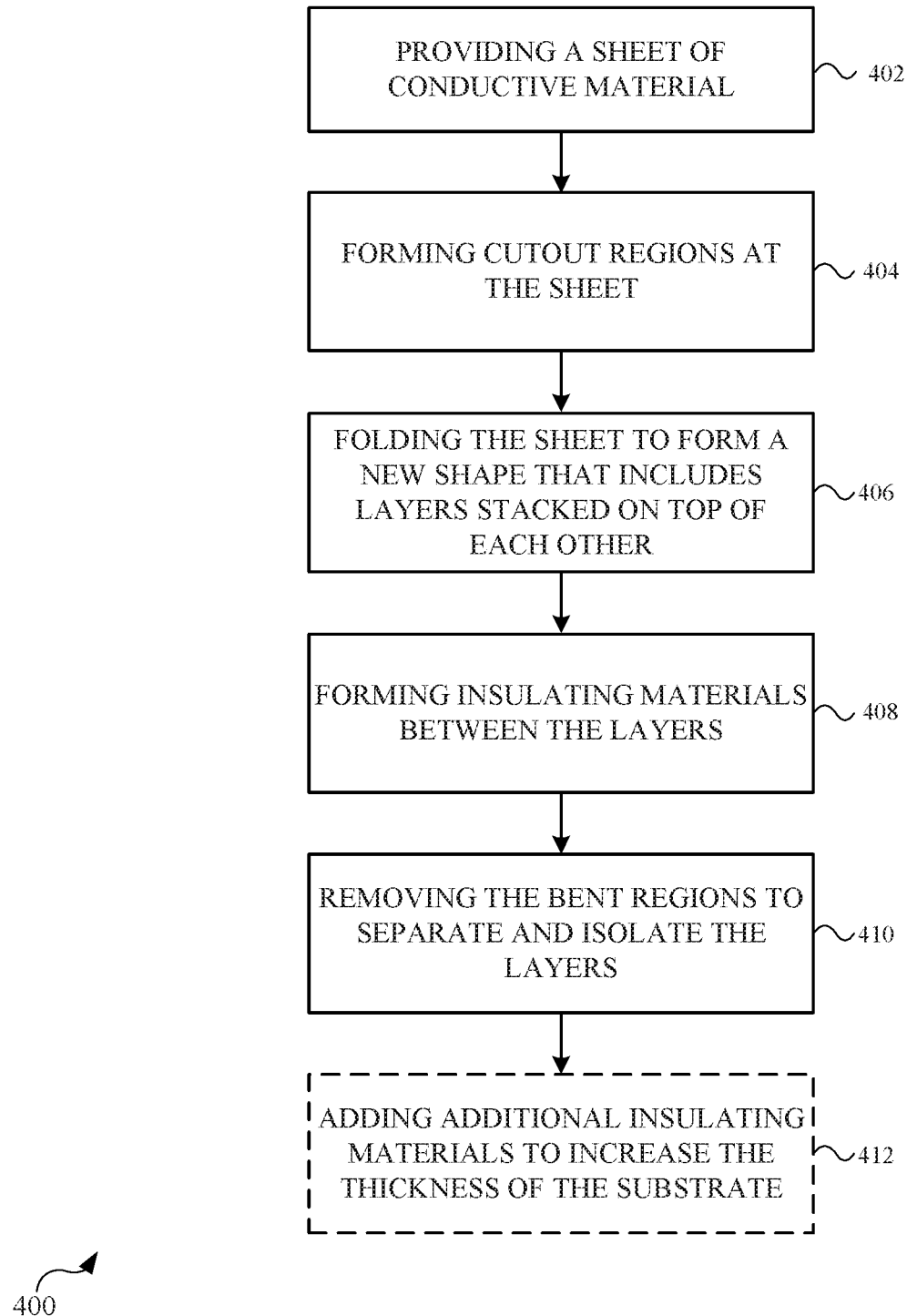
FIG. 4 is a flowchart depicting a method for making an interposer in accordance with some embodiments.

FIG. 4 through FIG. 8 illustrates a method to make an exemplary interposer that can be used as interposer 106 shown in FIGS. 1-3. FIG. 4 illustrates a flowchart depicting an exemplary method for making an interposer in accordance with some embodiments. FIGS. 5-8 illustrate the change in shapes and configurations of the materials in forming the interposer.

Referring to FIG. 4, an exemplary method 400 for making an interposer can begin at step 402, where a sheet formed of a metal or a suitable bendable conductive material is provided. In one case, the sheet can be a strip being characterized as having a longitudinal axis that defines the direction of elongation.

At step 404, a series of cutout regions can be formed at the sheet. The cutout regions can be formed by any suitable machining processes including stamping and/or cutting such as die cutting. The series of cutout regions can form a comb pattern on the sheet that includes conductive bars alternating with the cutout regions.

At step 406, the sheet can be folded to form a new shape that can include conductive layers stacked on top of each other. At least one of the conductive layers can retain the comb pattern. At this stage, the stacked conductive layers, which are formed by the folding of the same conductive sheet, can remain joined by the bent regions of the sheet.

At step 408, insulating materials can be formed between the conductive layers. It should be noted that the insulating materials could be secured to the sheet before or after the sheet is folded. For example, the insulating materials can be a heat-activated film that can be laminated on at least a portion of a surface of the sheet before the sheet is folded. Alternatively, insulating materials can be inserted into the folded sheet and be melt to form a non-conductive matrix. The layers of insulating materials can cooperate to form a substrate.

At step 410, the bent regions can be removed such that the conductive layers are separated from each other. Since insulating materials have been formed between the conductive layers, each conductive layer can then be electrically isolated by the insulating materials. Within a layer, the conductive bars are separated from each other by the cutout regions. Between layers, the conductive bars are also separated by the insulating materials. In some cases, the insulating materials can be melt and can fill the voids of the cutout regions. In any cases, the conductive bars can be electrically isolated and physically separated from each other so that they can serve as discrete electrically conductive pins that are capable of transmitting signals between two circuit boards.

At optional step 412, an additive process such as injection molding can be performed on the interposer to add additional insulating materials to further increase the thickness of the non-conductive substrate to provide better protection to the pins. The optional step 412 can be performed before or after step 410.

Figure 5:
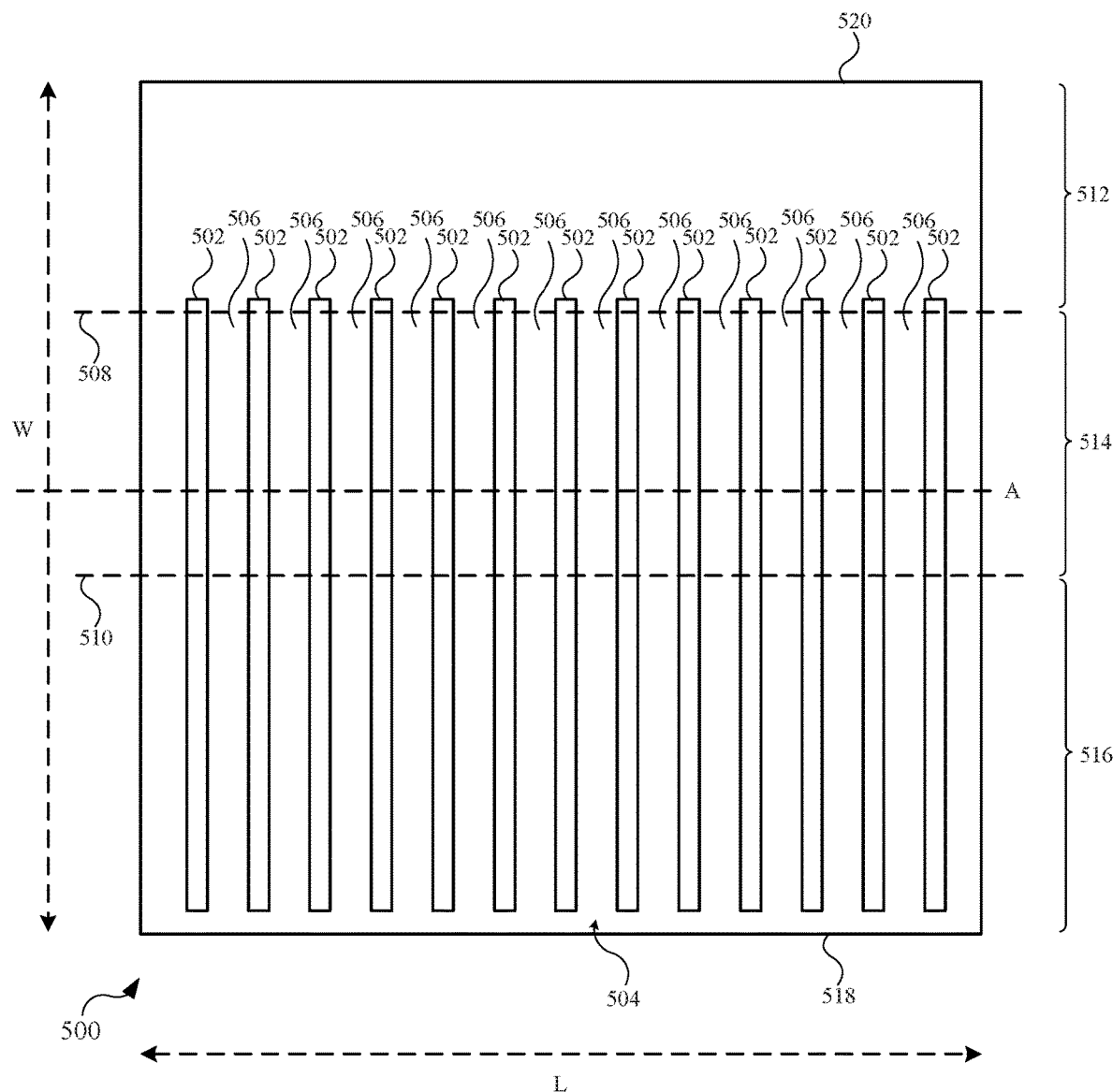
FIG. 5 illustrates cutout patterns of a conductive sheet in accordance with some embodiments.

FIGS. 5 through 8 illustrates the shapes and configurations of the materials used to make an interposer in accordance with the method described in FIG. 4. FIG. 5 illustrates a sheet 500 that can be formed of any suitable conductive material such as a metal. In one case, the conductive material can be copper or a copper alloy such as a high strength copper alloy. Non-metallic electrically conductive material can also be used but a material that is bendable and malleable is more preferred. In one case, the shape of sheet 500 can be closer to a square, as shown in FIG. 5. However, in other cases, sheet 500 can be a long strip that can have a length L that is much longer than the width W. In some cases, the length L can be ten to hundred times longer than the width W. For simplicity, only a section of the length of the long strip is illustrated in FIG. 5. For the case where 500 is elongated along the length L, the sheet can be characterized as having a longitudinal axis A that defines the direction of elongation.

FIG. 5 shows the state of the sheet that corresponds to step 404 of method 400. A series of cutout regions 502 can be formed by cutting and/or stamping. The shapes, patterns, distribution and locations of cutout regions 502 may vary. In this particular embodiment, a series of elongated parallel cutout regions 502 can be formed in a direction that is generally perpendicular to the longitudinal axis A. The series of cutout regions 502 can form a comb pattern 504 that can include alternating conductive bars 506 and cutout regions 502 (i.e. cutout strips). Dashed lines 508 and 510 can represent a first fold line 508 and a second fold line 510 along which sheet 500 can be bent and folded. In one case, fold lines 508 and 510 can be generally parallel to the longitudinal axis. However, in other cases other directions of folding are also possible. Fold lines 508 and 510 can generally define three regions of sheet 500, which can be first region 512, second region 514, and third region 516. Cutout regions 502 can be positioned towards a first edge 518 that is parallel to longitudinal axis A so that second region 514 and third region 516, which are closer to first edge 518, can include the cutout regions 502. Hence, second region 514 and third region 516 can include the comb pattern 504. First region 512, which is closer to second edge 520 and is away from the first edge 518, can be generally free of cutout regions 502.

As it will be discussed in further detail, when the interposer is formed, first region 512, which can be a continuous region of solid conductive material, can become a first conductive layer of the interposer that can serve as an electromagnetic shield. For example, first region 512 can correspond to first layer 126 of interposer 106 shown in FIGS. 1-3. Second region 514 and third region 516 can form discrete pins for the interposer. For example, conductive bars 506 can correspond to pins 136 of interposer 106 shown in FIGS. 1-3.

Figure 6:
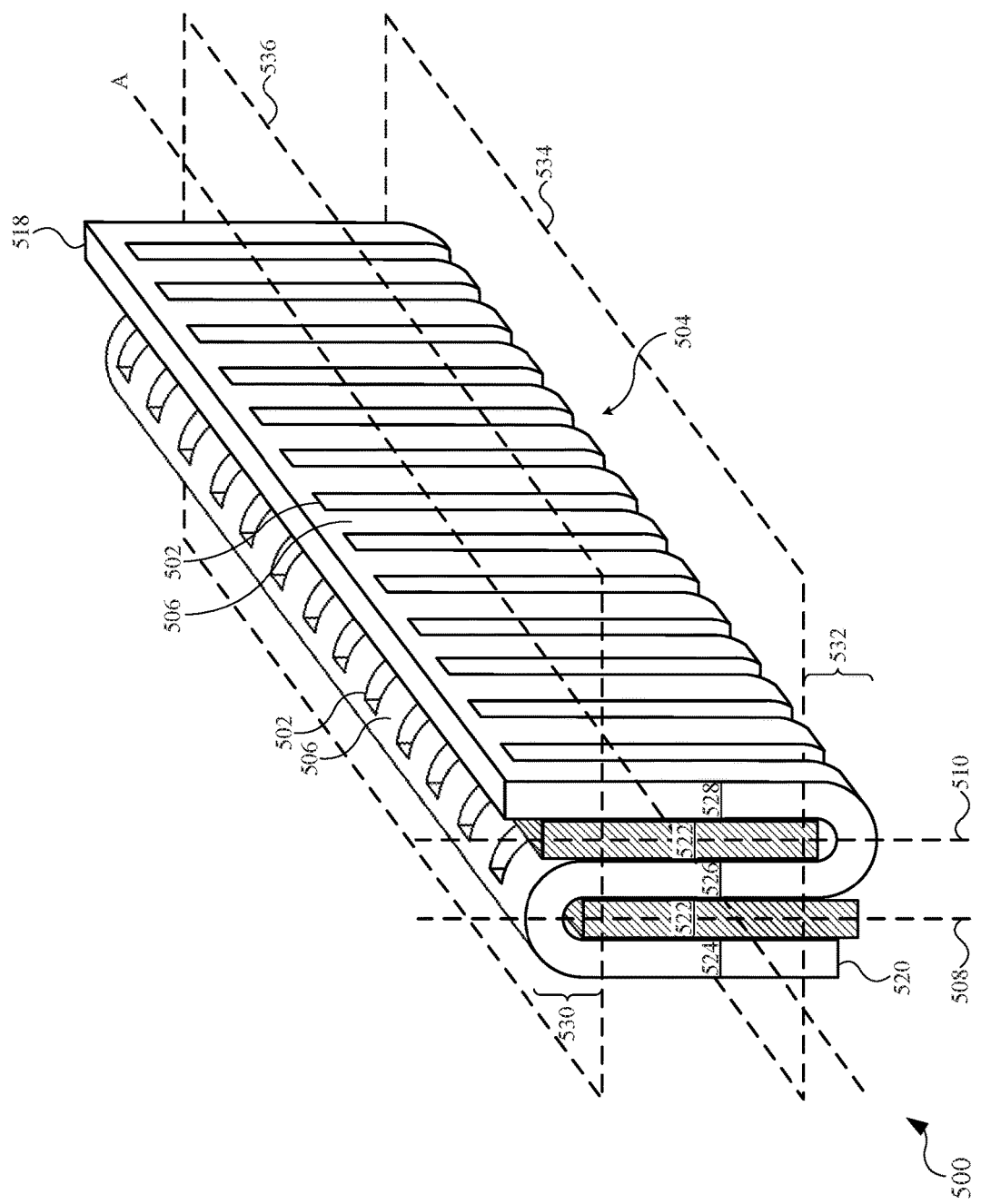
FIG. 6 is the conductive sheet in FIG. 5 that is folded into a new shape.

Referring to FIG. 6, sheet 500 can be folded into a new shape. FIG. 6 can correspond to step 406 and 408 in which sheet 500 is folded into multiple conductive layers 524, 526, and 528 stacked together and insulating layers 522 (shaded) are formed between the conductive layers. Preferably, the insulating layers can be formed of materials that are flexible or at least semi-flexible. The insulating layers 522 can be formed before or after sheet 500 is folded and can be adhered to sheet 500 suing any suitable methods. In one case, before sheet 500 shown in FIG. 5 is folded, insulating materials can take the form of insulating films that can be laminated on one or more surfaces of regions 512, 514, and/or 516. The insulating films can be heat-activated films that can be adhered to sheet 500 when heat is applied. If sheet 500 is an elongated strip, the insulating film can also be a long strip that can be laminated on sheet 500. In one particular case, first, an insulating strip can be laminated on a first surface of second region 514 before sheet 500 is folded. Second, sheet 500 can be folded 180 degree once along fold line 508 so that an insulating layer 522 formed by the lamination is positioned between first region 512 and second region 514. Third, a second insulating strip can be laminated on a second surface of second region 514 opposite the first surface. Fourth, sheet 500 can be folded 180 degree again along fold line 510 to form the structure shown in FIG. 6.

In other cases, insulating materials can be applied after sheet 500 is folded. For example, insulating materials can take the form of solid or liquid resins or other similar curable materials that can be added to the spaces between the conductive layers. The resins or other similar curable materials can be cured by heat or by chemical reaction such as by an addition of a suitable chemical reagent. When the insulating materials are cured, the materials can form a matrix that can serve as a substrate to carry multiple discrete pins in a manner that will be described in more detail. In yet other cases, both insulating films and curable materials can be used to form the insulating portion of the interposer.

Sheet 500 can be folded along fold lines 508 and 510 in a zigzag manner to form a first conductive layer 524, a second conductive layer 526, and a third conductive layer 528 that are stacked together. In other words, sheet 500 can be folded along directions that are generally parallel to the longitudinal axis A so that the conductive layers 524, 526, and 528 are stacked along a direction that is generally perpendicular to the longitudinal axis A. First conductive layer 524 can be connected to second conductive layer 526 by a first bent region 530 that has been bent 180 degree. Similarly, second conductive layer 526 can be connected to third conductive layer 528 by a second bent region 532 that has also been bent 180 degree. Second conductive layer 526 can generally correspond to second region 514 (shown in FIG. 5 before sheet 500 is folded) so that second conductive layer 526 can include a part of the comb pattern 504 that includes alternating conductive bars 506 and cutout regions 502. Similarly, third conductive layer 528 can generally correspond to third region 516 (shown in FIG. 5 before sheet 500 is folded) so that second conductive layer 526 can also include a part of the comb pattern 504. On the contrary, first conductive layer 524 can generally correspond to first region 512 (shown in FIG. 5 before sheet 500 is folded) that is free of cutout regions 502. As shown in first bent region 530, cutout regions 502 end at first bent region 530 before reaching first conductive layer 524. Hence, first conductive layer 524 can be free of cutout regions 502 and can be a continuous piece of conductive layer that is suitable to be used as a shielding layer.

FIG. 6 also shows two planes 534 and 536 that represent the cut planes for performing the step of removing the bent regions 530 and 532 and extra materials. The cut planes 534 and 536 can be generally perpendicular to the stacks of conductive layers 524, 526, and 528 and be generally parallel or follow the direction of the longitudinal axis A. The removal step can correspond to step 410 in method 400. The removal step can be performed by any suitable cutting methods such as laser cutting and/or grinding such as a dual-disk grinding. All materials and regions below plane 534 and above plane 536 can be remove to form an interposer structure.

Figure 7:
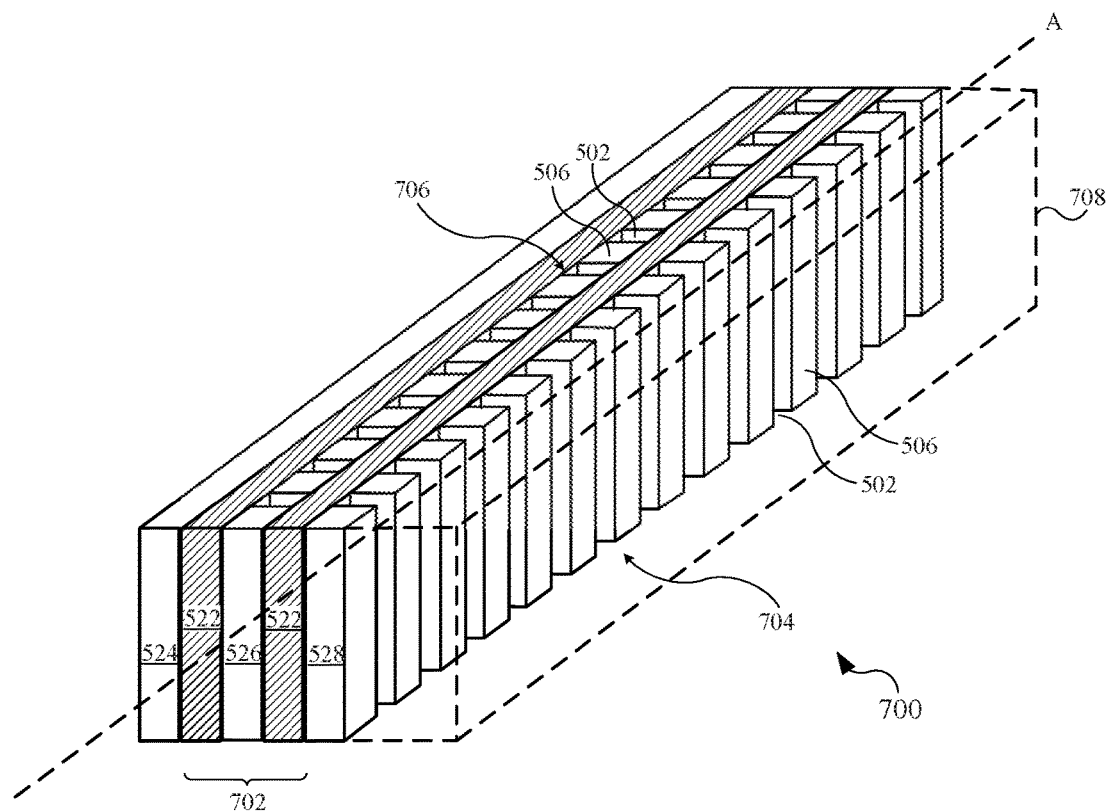
FIG. 7 is an interposer in accordance with some embodiments.

FIG. 7 illustrates an interposer 700 formed after the removal procedure that removes the extra materials and bent regions 530 and 532 shown in FIG. 6. Interposer 700 can be used as interposer 106 shown in FIGS. 1-3. Interposer 700 can include first conductive layer 524 that can be a strip of continuous electrically conductive layer. First conductive layer 524 of interposer 700 can correspond to first layer 126 of interposer 106. Insulating layers 522 can cooperate to define a substrate 702 that can be coupled to first conductive layer 524. After the bent regions 530 and 532 are removed, first conductive layer 524, second conductive layer 526, and third conductive layer 528 are separated from each other and are isolated by insulating layers 522. Within second conductive layer 526 or within third conductive layer 528, the conductive bars 506 are separated by cutout regions 502, which have become spaces. Each conductive bar 506 now becomes discrete and can be used as pins for interposer 700. Hence, conductive bars 506 can correspond to pins 136 of interposer 106. The pins of interposer 700 and first conductive layer 524 that is used as a shield can be formed of the same conductive material because both the pins and the first conductive layer 524 come from the same sheet 500. By using the method 400, an interposer with shielding capability and discrete pins can be formed in a precise and controlled manner.

FIG. 7 shows spaces among conductive bars 506. However, in some cases where insulating layers 522 are melt or are formed from liquid, the insulating materials may fill the spaces and form a substrate 702 in the form of a single matrix that carries multiple discrete pins.

By cutting or grinding to remove extra materials of multiple layers together, the removal procedural can result in flat mounting surfaces 704 (bottom surface of interposer 700 in FIG. 7) and 706 (top surface of interposer 700 in FIG. 7) in accordance with cut planes 534 and 536. Mounting surfaces 704 and 706 can be formed by the cooperation of first, second, and third conductive layers 524, 526, and 528 and insulating layers 522. Precisely controlled flatness of mounting surfaces 704 and 706 of interposer 700 may be required to ensure proper assembly of interposer 700 to circuit boards. Dual-disk grinding can be utilized to control both height and flatness of the interposer 700. For example, the folded sheet 500 shown in FIG. 6 can be placed between two rotating abrasive disks that are aligned to the desired thickness so that extra materials and bent regions 530 and 532 can be removed once the fold sheet 500 is processed down to the desired thickness when pressure is no longer applied by the disks to the fold sheet 500. As a result, first, second, and third conductive layers 524, 526, and 528 and insulating layers 522 can be flush with each other on both mounting surfaces 704 and 706. Mounting surfaces 704 and 706 can be generally perpendicular to first conductive layer 524 and can be used to mount respectively on a first circuit board and a second board. Conductive bars 506 can span between first mounting surface 704 and second mounting surface 706 and can be perpendicular to the longitudinal axis A. Hence, when interposer 700 is positioned between two circuit boards, conductive bars 506 can be in contact with both circuit boards for signal and/or thermal transmission.

An additive process such as injection molding can also be performed to add additional insulating material to interposer 700 to increase the thickness of substrate 702. Increasing the thickness of substrate 702 can increase the area of mounting surfaces 704 and 706 so that interposer 700 can have additional areas to mount on circuit boards. Increasing the thick of substrate 702 can also enhance the protection to the pins of interposer 700. The increased thickness 708 of substrate 702 is illustrated in FIG. 7 by dash lines.

Figure 8:
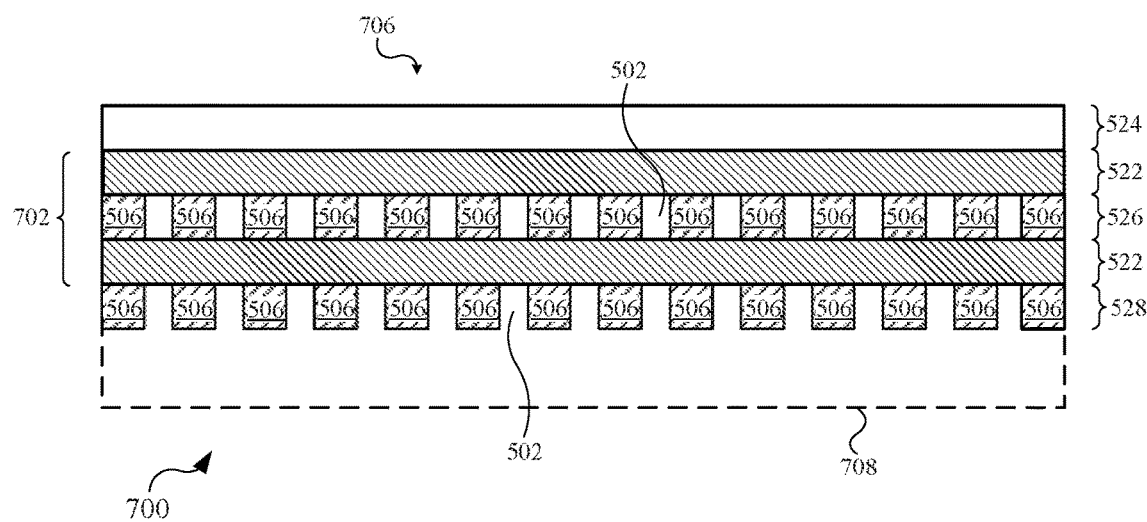
FIG. 8 is the top view of the interposer shown in FIG. 7.

FIG. 8 illustrates a top view of interposer 700 showing mounting surface 706. The shaded squares can be conductive bars 506 that are separated by cutout regions 502 and by insulating layers 522. The pattern and distribution of conductive bars 506 (i.e. pins) can be controlled by the pattern of cutout regions 502 when cutout regions 502 are first formed as in FIG. 5 and by how many times sheet 500 is folded. In this particular embodiment, cutout regions 502 in sheet 500 in FIG. 5 are regularly arranged in a parallel and evenly spaced manner. Also, the striated side of sheet 500 (i.e. regions of sheet 500 having the cutout regions 502 and excluding first region 512) is only folded once. Hence, two rows of pins are formed as a result.

Figure 9:
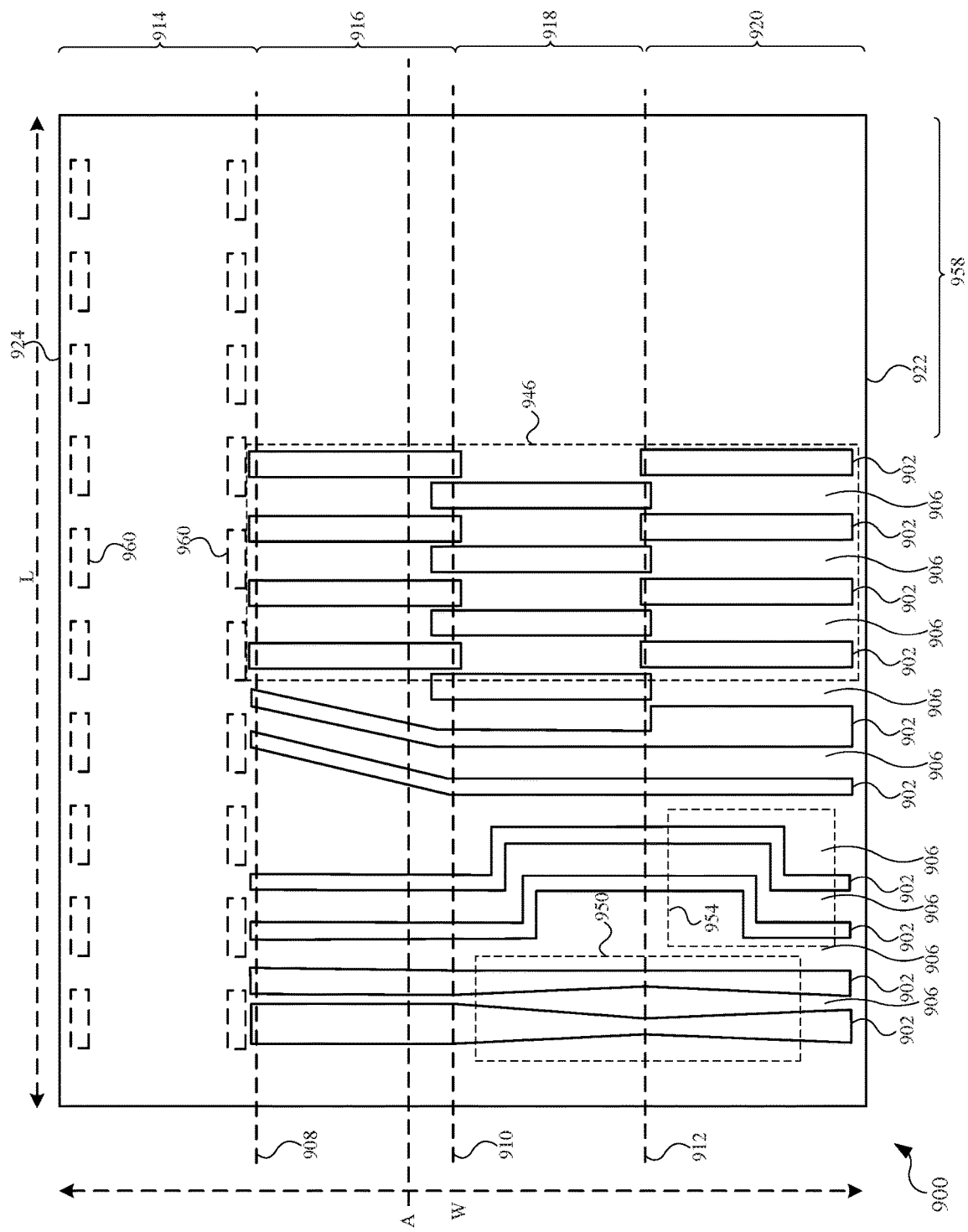
FIG. 9 illustrates cutout patterns of another conductive sheet in accordance with some embodiments.
Figure 10:
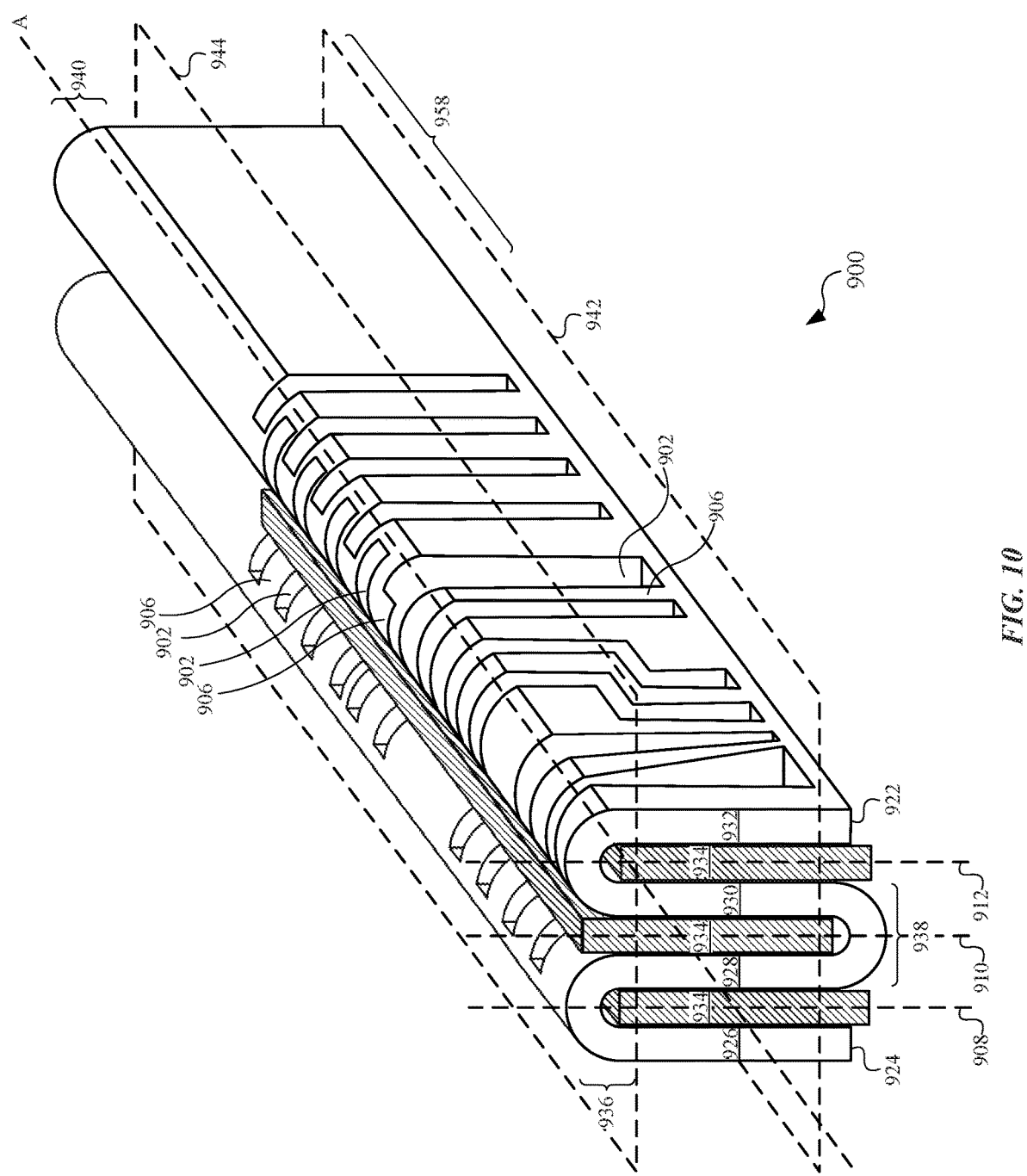
FIG. 10 is the conductive sheet in FIG. 9 that is folded into a new shape.
Figure 11:
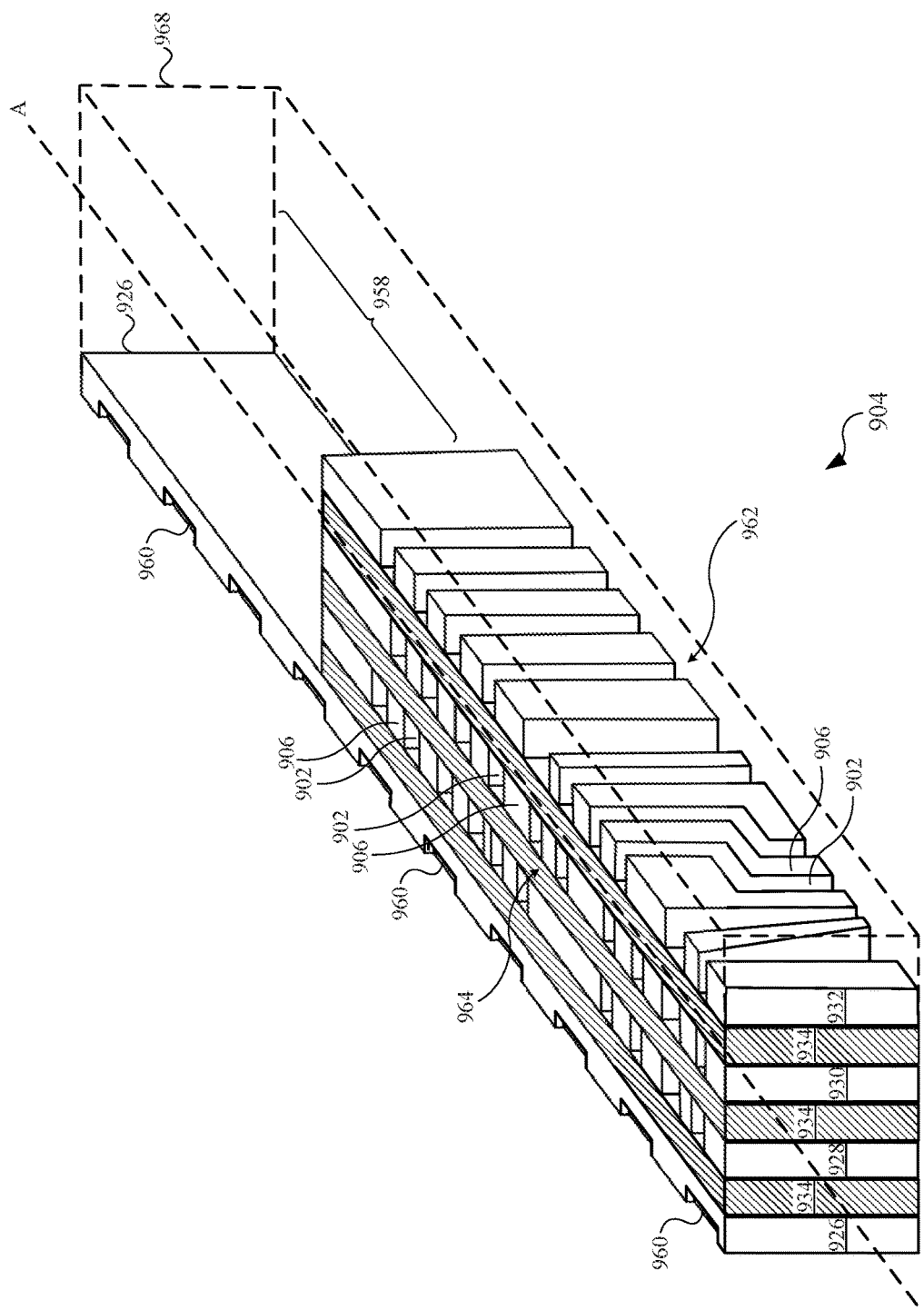
FIG. 11 is an interposer in accordance with some embodiments.

FIGS. 9-13 illustrate a process in accordance with method 400 for making an interposer that is similar to interposer 700 but the process can vary as for the pin patterns and the number of folding and can include additional features. Similar to the process illustrated in FIG. 5-8, the process in FIGS. 9-13 can include forming cutout regions at a conductive sheet, folding the sheet, and removing bent regions and extra material according to cut planes to form the interposer. FIG. 9 illustrates a sheet 900 of a conductive material that includes various cutout regions 902. FIG. 10 illustrates sheet 900 being folded into a new shape that includes a stack of conductive layers. FIG. 11 illustrates interposer 904 formed after bent regions and extra materials are removed. FIG. 12 is a front view of the interposer 904 and FIG. 13 is a top view of the interposer 904. Similar to sheet 500, it should be noted that sheet 900 could sometimes have a length L along the longitudinal axis A that is significantly longer than width W. In other words, sheet 900 can sometimes also be referred to as a strip that can be elongated along the longitudinal axis A. For simplicity, a segment of the strip is shown in FIG. 9 as sheet 900.

Sheet 900 can include a series of cutout regions 902 that can be formed by cutting and/or stamping. The cutout regions 902 cooperate to define a comb pattern that can include alternating conductive bars 906 and cutout regions 902. Compared to sheet 500, which is illustrated as being folded twice, sheet 900 can be folded three times in accordance with a first fold line 908, a second fold line 910, and a third fold line 912. However, it should be understood that the number of folding is not limited to two or three times. A conductive sheet in accordance with some embodiments can be folded any number of times, including once, which will result in a single row of pins. The fold lines 908, 910, and 912 can generally define four regions of sheet 900, which can be first region 914, second region 916, third region 918, and fourth region 920. Similar to sheet 500, cutout regions 902 can be positioned towards a first edge 922 that is parallel to longitudinal axis A so that second, third, and fourth regions 916, 918, and 920, which are closer to first edge 922, can include the cutout regions 902 and the comb pattern.

First region 914, which is closer to second edge 924 and is away from the first edge 922, can be generally free of cutout regions 902.

The number of rows of pins of the interposer 904 formed can be controlled by the number of times sheet 900 is folded. As illustrated in FIG. 10, since sheet 900 is folded three times, four conductive layers are formed, which can be first conductive layer 926, second conductive layer 928, third conductive layer 930, and fourth conductive layer 932. Insulating layers 934 are formed among those conductive layers. Three bent regions 936, 938, and 940 maintain the connections among the conductive layers 926, 928, 930, and 932. As cutout regions 902 end before reaching first conductive layer 926, first conductive layer 926, which can generally correspond to first region 914, can be free of cutout regions 902 and can be a continuous piece of conductive layer that is suitable to be used as a shielding layer. Second, third, and fourth conductive layers 928, 930, and 932, which can generally correspond to second, third and fourth regions 916, 918, 920 (shown in FIG. 9), can include the cutout regions 902. Since three conductive layers with cutout regions 902 are formed, three rows of discrete pins can be formed after the bent regions 936, 938, and 940 are removed, as illustrated in FIG. 11, in accordance with cut planes 942 and 944. In one case, the cut planes 942 and 944 can be generally perpendicular to the stacks of conductive layers 926, 928, 930, and 932 and be generally parallel or follow the direction of the longitudinal axis A.

The patterns, shapes, and distribution of the pins of interposer 904 shown in FIGS. 11-13 can be controlled by the original patterns of cutout regions 902 before sheet 900 is folded shown in FIG. 9. Referring to FIGS. 11, 12, and 13, interposer 904 can include discrete conductive bars 906 that are separated from each other after the removal of the bent regions. The conductive bars 906 can be isolated by cutout regions 902 and insulating layers 934 so that conductive bars 906 can serve as the pins of interposer 904. Unlike the conductive bars 506 shown in FIG. 7 which have regular and parallel patterns, conductive bars 906 can have various shapes and patterns that are in accordance with the original cutout pattern in sheet 900 shown in FIG. 9.

For example, sheet 900 in FIG. 9 can include an area 946 that include alternating comb patterns across second, third and fourth regions 916, 918, 920. As a result of the cutout pattern in area 946, the three rows of pins in region 948 shown in FIG. 13 can also show an alternating pattern. In area 950, sheet 900 in FIG. 9 can also include cutout regions 902 that are tapered. As a result of the cutout shape in area 950, a pin 952 labeled in FIG. 12 can have an inverted trapezoidal shape. Moreover, sheet 900 in FIG. 9 can include cutout regions 902 in area 954 that make turns in the middle of fourth region 920. As a result of the cutout shape in area 956, a pin 966 labeled in FIG. 12 can have a shape of a step. While several cutout shapes and patterns are illustrated in FIGS. 9-12, it should be understood that those cutout shapes and patterns are examples only and other various shapes and patterns can also be possible. The method described herein can provide a simple and convenient way to control the exact shapes and patterns of the pins of an interposer by manipulating the shapes and patterns of the cutout regions of the conductive sheet before the sheet is folded.

Still referring to FIG. 9, sheet 900 can include a section 958 that is free of any cutout region. After sheet 900 is folded, insulating layers may or may not be formed at section 958. In a particular case shown in FIG. 10, insulating layers 934 are not formed at section 958. After bent regions 936, 938, and 940 are removed, second, third, and fourth conductive layers 928, 930, and 932 at section 958 are cut loose so that only first conductive layer 926 remains at section 958, as shown in FIG. 11. An optional additive process can be used to form insulating materials on first conductive layer 926 and to increase the thickness of the substrate that carries the multiple rows of conductive bars 906. The optional additive insulating materials are illustrated by dashed lines and labeled as 968. Section 958 after interposer 904 is formed can correspond to section of an interposer that is free of pins. For example, section 958 can correspond to a section 158 of interposer 106 as shown in FIG. 1. Since section 958 includes mainly first conductive layer 926, which can typically be made by a bendable and malleable conductive material such as a metal, section 958 is particularly suited for use in sections of the interposer that requires contouring and bending, such as section 158 shown in FIG. 1 and any other sections that may contour around a standout of a circuit board.

To promote the mounting of interposer 904 to a circuit board, in some cases castellation features 960 can be formed on sheet 900 before it is folded. Castellation features 960 are illustrated as a series of dashed rectangles in FIG. 9. The castellation features 960 can be features that are recessed from a surface of sheet 900. The castellation features 960 can be formed by any suitable removal process including etching and/or scraping. Referring to FIGS. 11, 12, and 13, after interposer 904 is formed, castellation features 960 can be recessed from both a mounting surface and an exterior surface of first conductive layer 926. Castellation features 960 can be present in both mounting surfaces 962 and 964. Castellation features 960 can receive solder in a suitable soldering process such as a reflow soldering so that interposer 904 can be mounted onto circuit boards.

Figure 14:
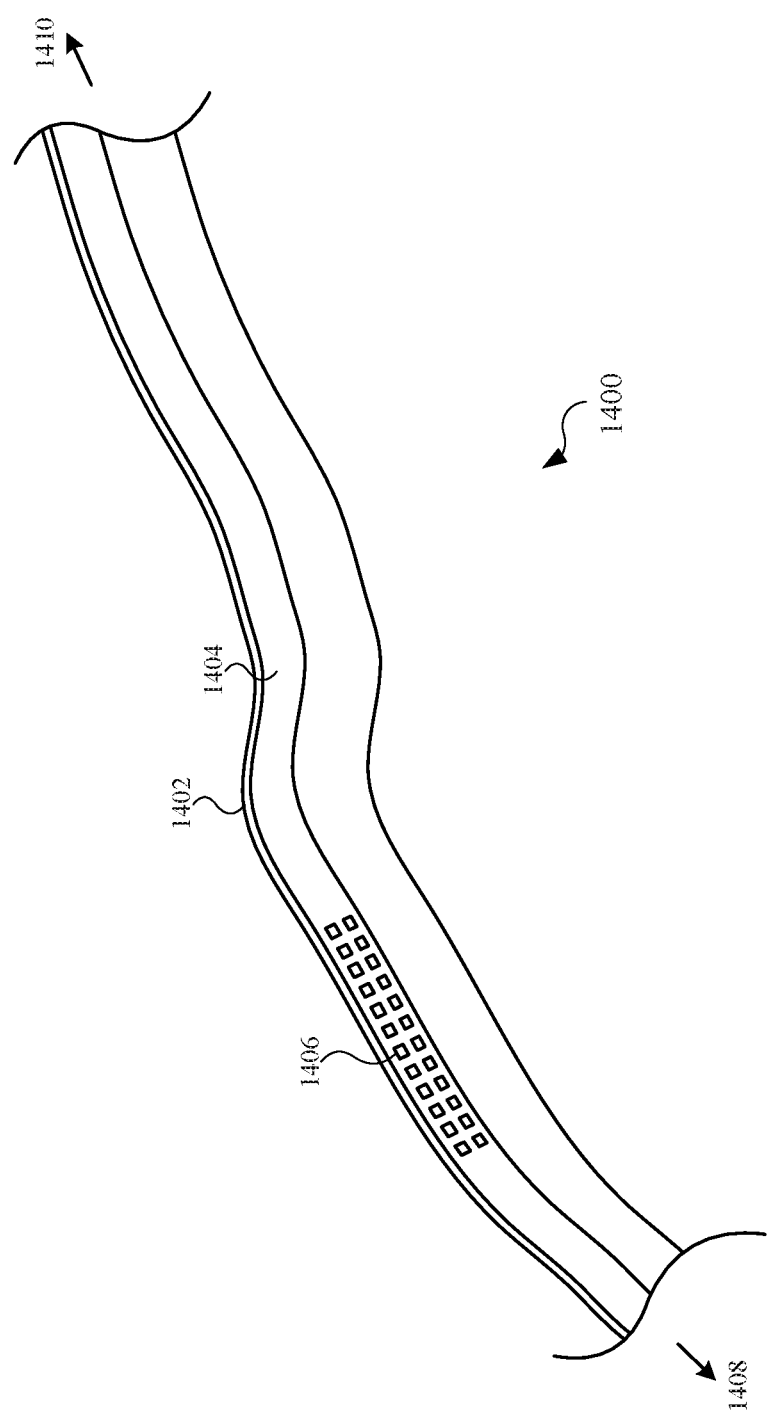
FIG. 14 shows an interposer strip in accordance with some embodiments.

FIG. 14 illustrates an interposer 1400 formed using the processes described in FIGS. 4-12. As discussed above, both sheet 500 and sheet 900 can sometimes be long strips that have lengths L significantly longer than widths W. Hence, a resultant multi-layer interposer can also be a long strip as illustrated in FIG. 14. Interposer 1400 can include first conductive layer 1402 and substrate layer 1404 that carries multiple discrete pins 1406. Substrate layer 1404 can be formed by multiple insulating layers as discussed previously. For simplicity, other details of interposer 1400 are not illustrated. Interposer 1400 can be a long strip having a first distal end 1408 and a second distal end 1410, which are not shown in FIG. 14. Since first conductive layer 1402 and substrate layer 1404 can both be made of flexible material, interposer 1400 can also be flexible and can be bent into different shape.

Figure 15:
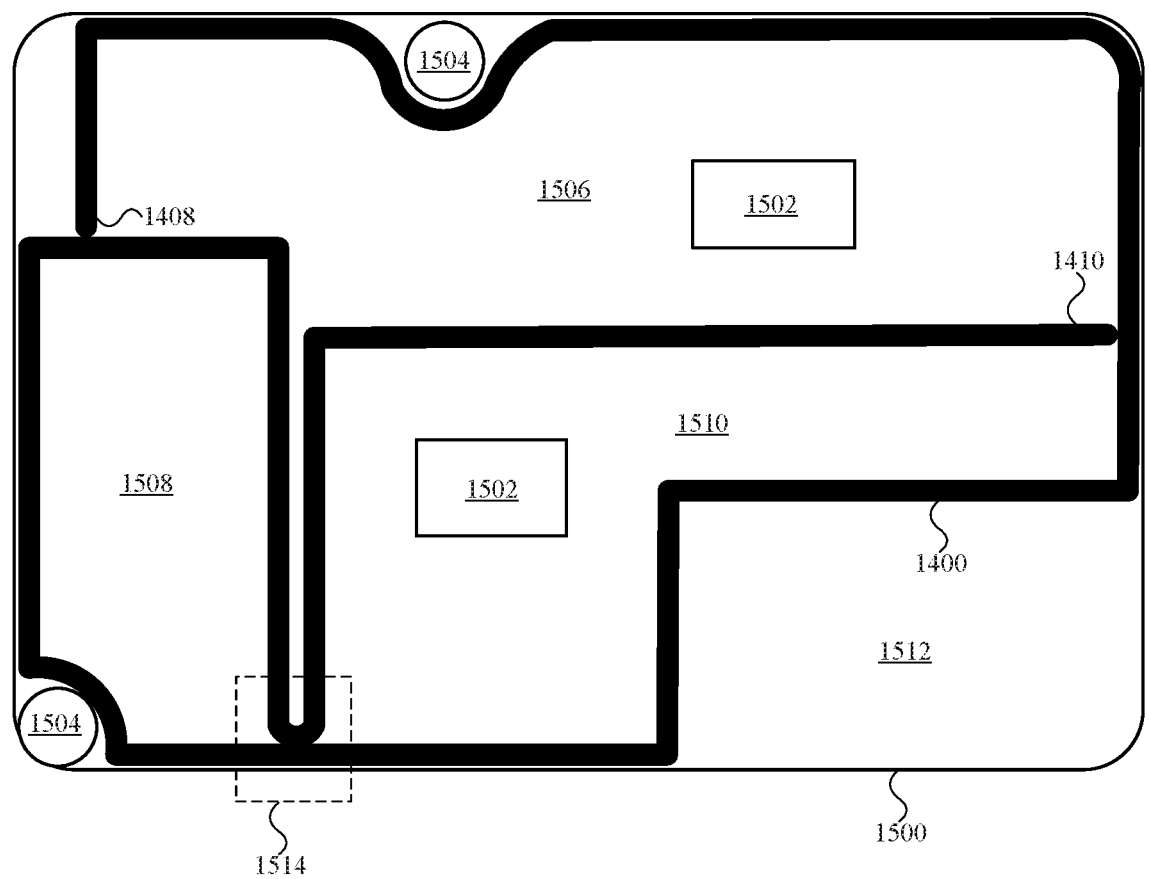
FIG. 15 shows a circuit assembly in accordance with some embodiments.

FIG. 15 illustrates interposer 1400 (represented by a thick line) that can be bent into different shapes. In some cases, an interposer can be bent substantially in accordance with a perimeter of a circuit board such that the interposer encloses substantially the entire circuit board. In the particular embodiment shown in FIG. 15, interposer 1400 can be bent to define multiple sub-sections of a circuit board 1500. Each sub-section can be shielded by interposer 1400. Circuit board 1500 can include multiple components 1502 and standoff features 1504. Interposer 1400 can be a long strip that can be cut to a desired length and bent into to divide circuit board 1500 into different sub-sections. Interposer 1400 can be bent to define a first enclosed section 1506, a second enclosed section 1508, and a third enclosed section 1510. In some locations interposer 1400 can be bent 90 degree and in other locations interposer 1400 can even be bent 180 degree. Each enclosed section is shielded by interposer 1400. Interposer 1400 can also be bent around standoff features 1504 to avoid the standoff features. Interposer 1400 can also further be bent inward at section 1512 so that section 1512 is exposed and is not shielded. Unlike interposer 106 shown in FIG. 1, interposer 1400 can have a first distal end 1408 and a second distal end 1410 that do not meet. Instead, the distal ends 1408 and 1410 can terminate against midsections of the strip of interposer 1400, thereby segmenting the internal area of circuit board 1500 to create two or more enclosed areas separated by the walls of interposer 1400. The separation can also be achieved by allowing midsections of interposer 1400 to come into contact or near contact to segment the internal area of circuit board 1500, such as at area 1514.

Figure 16:
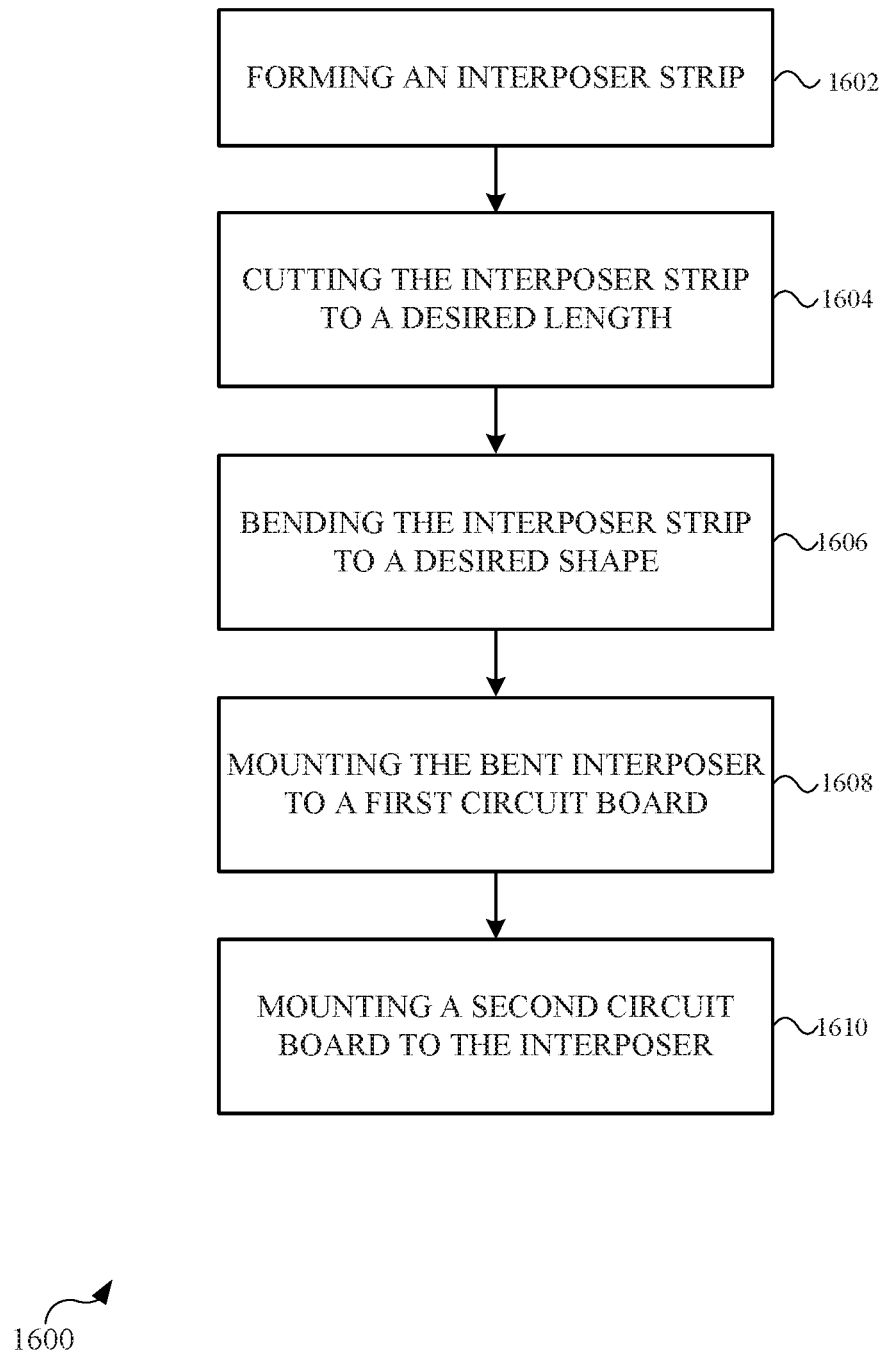
FIG. 16 is a flowchart depicting a method for coupling an interposer to circuit boards in accordance with some embodiments.

FIG. 16 illustrates a flowchart depicting a method 1600 for mounting an interposer on a circuit board in accordance with some embodiments. Method 1600 can start at step 1602, where an interposer strip is formed. At step 1604, the interposer strip can be cut to a desired length. At step 1606, the interposer strip can be bent to a desired shape that may match the contoured shape or a part of the contoured shape of a circuit board. The bending can be achieved with wire forming equipment, a press, a heated press, etc., depending on the thickness of interposer strip and material choices of the conductive material and the insulating material. At step 1608, a first mounting surface of the bent interposer can be secured to a first circuit board by any suitable method. For example, a reflow soldering process can be used to solder the interposer to the first circuit board. At step 1610, a second circuit board can be secured to a second mounting surface of the interposer board by a similar method.

The various aspects, embodiments, implementations or features of the described embodiments can be used separately or in any combination. The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An interposer for mechanically and electrically coupling together a first circuit board having first electrical components at a first surface and a second circuit board having second electrical components at a second surface, the first and second circuit boards having a circuit board shape and the first and second surfaces are separate from each by a separation distance and face each other in a face to face arrangement, the interposer comprising:
    an external wall, formed from an electrically conductive substrate, partially defines an electrically shielded volume and has: (i) a height, and (ii) a length in accordance with a shape of the first and second circuit boards;
    an electrically insulating substrate abuts an interior surface of the external wall and has a first mounting surface at a first end and a second mounting surface at a second end opposite the first end, the first and second mounting surfaces separated by the separation distance equal to the height; and
    a pin, formed from the electrically conductive metal and having a length that at least equals the height of the external wall, abuts an interior surface of the electrically insulating substrate from the first to the second mounting surfaces.

2. The interposer as recited in claim 1, wherein in an assembled state, the first and second circuit boards face each other and are secured to and supported by the external wall in such a way that (i) the first and second electrical components are located within the electrically shielded volume, and (ii) the pin is electrically coupled to, at the first and second mounting surfaces, respectively, the first and second circuit boards so as to facilitate communication therebetween.

3. The interposer as recited in claim 1, wherein the electrically insulating substrate electrically isolates the pin from the external wall.

4. The interposer as recited in claim 1, wherein the electrically insulating substrate has a length that corresponds to a perimeter of the first and second circuit boards.

5. The interposer as recited in claim 1, wherein the external wall includes a castellation feature that is recessed in the first mounting surface.

6. The interposer as recited in claim 1, wherein the pin is one of an array of pins that are arranged in rows and columns.

7. The interposer as recited in claim 1, wherein the pin is one of an array of pins that are arranged in an alternating pattern.

8. The interposer as recited in claim 1, wherein the exterior wall, the pin and the electrically insulating substrate are conformally bendable.

9. A circuit assembly, comprising:
    a first circuit board has a first electrical component at a first surface;
    a second circuit board has a second electrical component at a second surface that is facing and separated from the first surface by a separation distance;
    an interposer includes (i) an external wall in the form of a sheet of electrically conductive metal having a height equal to the separation distance, wherein the external wall secures together the first and second circuit boards in a manner that defines a closed volume that is electrically shielded by the external wall such that the first and second electrical components located therein are electrically isolated from an environment outside of the external wall and (ii) an electrically insulative substrate abutting an interior surface of the external wall includes a first mounting surface that abuts the first circuit board at the first surface, and a second mounting surface that abuts the second circuit board at the second surface, the first and second mounting surfaces separated by the separation distance; and
    an electrically conductive pin has a length at least equal to the height of the external wall is embedded within the electrically insulative substrate electrically and connects to the first electrical component at the first mounting surface and the second electrical component at the second mounting surface so as to facilitate communication therebetween.

10. The circuit assembly as recited in claim 9, wherein the external wall has a length in accordance with a perimeter of the first circuit board.

11. The circuit assembly as recited in claim 9, wherein the internal volume has a cross sectional area in accordance with an area of the first and the second surfaces.

12. The circuit assembly as recited in claim 9, wherein a portion of the interposer is bent around a standoff.

13. The circuit assembly as recited in claim 9, wherein the pin is one of an array of pins arranged in an alternating pattern on the first mounting surface.

\* \* \* \* \*